US009825591B2

(12) United States Patent
Lam et al.

(10) Patent No.: US 9,825,591 B2
(45) Date of Patent: *Nov. 21, 2017

(54) DYNAMIC ERROR VECTOR MAGNITUDE DUTY CYCLE CORRECTION

(71) Applicant: SKYWORKS SOLUTIONS, INC., Woburn, MA (US)

(72) Inventors: Lui Lam, Lexington, MA (US); Mark M. Doherty, Westford, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/293,073

(22) Filed: Oct. 13, 2016

(65) Prior Publication Data
US 2017/0033746 A1 Feb. 2, 2017

Related U.S. Application Data

(63) Continuation of application No. 14/490,488, filed on Sep. 18, 2014, now Pat. No. 9,503,026.
(Continued)

(51) Int. Cl.
H03F 1/02 (2006.01)
H04B 1/04 (2006.01)
(Continued)

(52) U.S. Cl.
CPC ......... *H03F 1/0222* (2013.01); *H03F 1/0266* (2013.01); *H03F 1/0277* (2013.01); *H03F 1/56* (2013.01); *H03F 3/195* (2013.01); *H03F 3/217* (2013.01); *H03F 3/245* (2013.01); *H03F 3/72* (2013.01); *H04B 1/04* (2013.01);
(Continued)

(58) Field of Classification Search
USPC ................. 330/136, 285, 296, 289
See application file for complete search history.

(56) References Cited

U.S. PATENT DOCUMENTS 4,245,336 A 1/1981 Stietenroth
6,331,799 B1 12/2001 Miyazawa
(Continued)

FOREIGN PATENT DOCUMENTS

CN 1934784 A 3/2007
CN 101414805 4/2009
(Continued)

OTHER PUBLICATIONS

U.S. Appl. No. 14/448,793, filed Jul. 31, 2014.

*Primary Examiner* — Hieu Nguyen
(74) *Attorney, Agent, or Firm* — Knobbe, Martens, Olson & Bear, LLP

(57) ABSTRACT

Aspects of this disclosure relate to dynamic error vector magnitude (DEVM) compensation. In one embodiment, an apparatus includes an amplifier, a low pass filter, and a bias circuit. The amplifier, such as a power amplifier, can amplify an input signal. The low pass filter, such as an integrator, can generate a correction signal based at least partly on an indication of a duty cycle of the amplifier. The indication of the duty cycle of the amplifier can be an enable signal for the amplifier, for example. The bias circuit can generate a bias signal based at least partly on the correction signal and provide the bias signal to the amplifier to bias the amplifier.

20 Claims, 10 Drawing Sheets

Related U.S. Application Data

(60) Provisional application No. 61/880,005, filed on Sep. 19, 2013.

(51) Int. Cl.
  *H03F 1/56* (2006.01)
  *H03F 3/195* (2006.01)
  *H03F 3/24* (2006.01)
  *H03F 3/217* (2006.01)
  *H03F 3/72* (2006.01)

(52) U.S. Cl.
  CPC .. *H03F 2200/111* (2013.01); *H03F 2200/165* (2013.01); *H03F 2200/336* (2013.01); *H03F 2200/351* (2013.01); *H03F 2200/387* (2013.01); *H03F 2200/429* (2013.01); *H03F 2200/451* (2013.01); *H03F 2200/555* (2013.01); *H03F 2203/7209* (2013.01); *H03F 2203/7221* (2013.01); *H03F 2203/7236* (2013.01)

(56) References Cited

U.S. PATENT DOCUMENTS

| | | | |
|---|---|---|---|
| 6,873,211 B1 | 3/2005 | Thompson et al. | |
| 7,348,847 B2 * | 3/2008 | Whittaker | H03F 1/0211 330/250 |
| 7,439,806 B2 | 10/2008 | Dow | |
| 7,567,123 B2 | 7/2009 | Leung | |
| 7,795,980 B2 | 9/2010 | Griffiths et al. | |
| 7,821,335 B2 | 10/2010 | Shiramizu et al. | |
| 7,869,775 B2 | 1/2011 | Alon et al. | |
| 7,928,804 B2 | 4/2011 | Yamamoto et al. | |
| 8,666,339 B2 | 3/2014 | Yu et al. | |
| 8,717,101 B2 | 5/2014 | Li et al. | |
| 9,136,803 B2 | 9/2015 | Li et al. | |
| 9,503,026 B2 | 11/2016 | Lam et al. | |
| 2001/0041547 A1 | 11/2001 | Kazakevich et al. | |
| 2005/0032488 A1 | 2/2005 | Pehlke et al. | |
| 2005/0134374 A1 | 6/2005 | Hench et al. | |
| 2007/0024372 A1 | 2/2007 | Hagen | |
| 2008/0180169 A1 | 7/2008 | Ripley et al. | |
| 2009/0195318 A1 | 8/2009 | Kang et al. | |
| 2010/0156539 A1 | 6/2010 | Ha et al. | |
| 2011/0134664 A1 | 6/2011 | Berghegger | |
| 2012/0286873 A1 | 11/2012 | Li | |
| 2013/0141167 A1 | 6/2013 | Kim et al. | |
| 2013/0307625 A1 | 11/2013 | Hershberger et al. | |
| 2013/0307627 A1 | 11/2013 | Hershberger | |
| 2015/0035605 A1 | 2/2015 | Lam | |
| 2015/0077187 A1 | 3/2015 | Lam et al. | |
| 2015/0180518 A1 | 6/2015 | Whittaker | |
| 2015/0349730 A1 | 12/2015 | Li et al. | |

FOREIGN PATENT DOCUMENTS

| | | |
|---|---|---|
| CN | 103036509 A | 4/2013 |
| JP | 2000-252766 | 9/2000 |
| JP | 2007-019784 | 1/2007 |
| TW | 200746621 | 12/2007 |
| TW | 200810347 | 2/2008 |

* cited by examiner

DYNAMIC ERROR VECTOR MAGNITUDE DUTY CYCLE CORRECTION

CROSS REFERENCE TO RELATED APPLICATIONS

This application is a continuation of U.S. patent application Ser. No. 14/490,488, filed Sep. 18, 2014, titled "DYNAMIC ERROR VECTOR MAGNITUDE DUTY CYCLE CORRECTION," which claims the benefit of priority under 35 U.S.C. §119(e) of U.S. Provisional Patent Application No. 61/880,005, filed Sep. 19, 2013, titled "DYNAMIC ERROR VECTOR MAGNITUDE DUTY CYCLE CORRECTION," the disclosures of each which are hereby incorporated by reference in their entireties.

BACKGROUND

Technical Field

Embodiments of the invention relate to electronic systems, and in particular, to biasing an amplifier.

Description of the Related Technology

Radio frequency (RF) power amplifiers can be used to boost the power of a RF signal having a relatively low power. Thereafter, the boosted RE signal can be used for a variety of purposes, including driving the antenna of a transmitter.

Power amplifiers can be included in mobile phones to amplify an RF signal for transmission. For example, in mobile phones that communicate using a wireless local area network (WLAN) protocol and/or any other suitable communication standard, a power amplifier can be used to amplify the RE signal. Amplifying the RE signal to an incorrect power level or introducing significant distortion of the original RE signal can cause a wireless device to transmit out of band and/or violate compliance with accepted standards. Biasing a power amplifier device can determine the voltage and/or current operating point of the amplifying devices within the power amplifier.

There is a need for improved power amplifier systems. Furthermore, there is a need for improving power amplifier biasing.

SUMMARY OF CERTAIN INVENTIVE ASPECTS

The apparatus, circuits, and methods described in the claims each have several aspects, no single one of which is solely responsible for its desirable attributes. Without limiting the scope of this invention, some prominent features will now be briefly discussed.

One aspect of this disclosure is an apparatus that includes an amplifier configured to amplify an input signal, a low pass filter, and a bias circuit. The low pass filter is configured to generate a correction signal based at least partly on an indication of a duty cycle of the amplifier. The bias circuit is configured to generate a bias signal based at least partly on the dynamic correction signal and to provide the bias signal to the amplifier to bias the amplifier.

The bias circuit can be configured to maintain a gain of the amplifier at a substantially constant value as the duty cycle of the amplifier changes. Alternatively or additionally, the bias circuit can be configured to maintain a phase of an output of the amplifier at a substantially constant value as the duty cycle of the amplifier changes. The bias circuit can receive an enable signal and to selectively pulse an output of the amplifier based at least partly on the enable signal. Changes in the bias signal can be inversely proportional to changes in the duty cycle of the amplifier. According to some implementations, the bias circuit can include a current source configured to generate a correction current based at least partly on the correction signal and the bias circuit can be configured to generate the bias signal based at least partly on the correction current.

The low pass filter can be an integrator configured to integrate the indication of the duty cycle of the amplifier. The integrator can include, for example, a charge pump. The low pass filter can be an analog circuit in some instances.

The amplifier can be a power amplifier. The power amplifier can include a bipolar transistor having a collector configured to provide an amplified version of the input signal and the bias circuit can be configured to provide the bias signal to a base of the bipolar transistor. The input signal can be a radio frequency signal. The indication of the duty cycle of the amplifier can be an enable signal for the power amplifier. The apparatus can be a mobile device that includes an antenna configured to transmit a radio frequency signal received from the power amplifier.

Another aspect of this disclosure is a method of biasing a power amplifier. The method includes integrating an indication of a duty cycle of the amplifier to generate a dynamic correction signal; generating a bias signal based at least partly on the dynamic correction signal; and biasing the amplifier using the bias signal.

The method can include amplifying a radio frequency signal with an amplifier and transmitting the amplifier radio frequency signal from an antenna. The amplifier can be a power amplifier. The bias signal can be, for example, a bias voltage. Biasing the amplifier can maintain a substantially constant gain of the amplifier as the duty cycle of the amplifier changes.

Another aspect of this disclosure is a circuit that includes a duty cycle tracking circuit and a bias circuit. The duty cycle tracking circuit is configured to generate an indication of a duty cycle of the amplifier over time and to adjust the indication of the duty cycle of the amplifier over time as the duty cycle of the amplifier changes. The bias circuit is in communication with the duty cycle tracking circuit. The bias circuit is configured to generate a bias signal based at least partly on the indication of duty cycle over time and to provide the bias signal to the amplifier to bias the amplifier.

The circuit can be configured to control the bias signal such that a gain of the amplifier is substantially constant as the duty cycle of the amplifier changes. The bias circuit can receive an enable signal and to control the amplifier so as to selectively pulse an output of the amplifier based at least partly on the enable signal.

The bias circuit can include a first current source configured to provide a first current when the amplifier is enabled and a second current source configured to provide a second current that is adjustable based at least partly on the indication of duty cycle of the amplifier over time, in which the bias circuit can be configured to generate the bias based on the first current and the second current.

The duty cycle tracking circuit can induce a low pass filter. In certain implementations, the duty cycle tracking circuit can be implemented by an integrator, such as a charge pump.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Apparatus and methods for biasing amplifiers, such as power amplifiers, are disclosed herein. In certain implementations, a power amplifier system includes a power amplifier and a bias circuit. The power amplifier can be used to amplify a radio frequency (RF) signal for transmission. The bias circuit can be used to generate a bias voltage and/or bias current for biasing the power amplifier. The bias circuit can receive an enable signal that can be used to enable or disable the power amplifier so as to pulse an output of the power amplifier. The enable signal can be used by the bias circuit to generate a bias signal to bias the power amplifier.

Self-heating of an amplifier, such as a power amplifier, typically affects the settling time for the amplifier. Relatively long settling times can affect dynamic error vector magnitude (DEVM). Previous DEVM compensation has been fixed for all operating conditions and duty cycles of the amplifier. With such DEVM compensation, different amounts of self-heating associated with different duty cycles have been overlooked and/or ignored.

Aspects of this disclosure relate to low pass filtering and/or integrating an indication of a duty cycle of an amplifier to generate a correction signal. For instance, an enable signal for a power amplifier can be low pass filtered using a low pass filter to generate a correction signal. In some instances, this can involve integrating the enable signal using an integrator to generate the correction signal. A bias circuit can generate a bias signal, such as a voltage bias and/or a current bias, based on the correction signal. The bias circuit can bias the amplifier using the bias signal to compensate for DEVM. This can keep a gain of the amplifier substantially constant. For example, the bias circuit can keep the collector current of a bipolar power amplifier transistor at a substantially constant current based on the correction signal. Accordingly, the bias of an amplifier can be generated such that DEVM can be compensated for to account for variations in the duty cycle of the amplifier.

While this disclosure may describe examples in connection with power amplifiers for illustrative purposes, the principles and advantages described herein may be applied to other suitable amplifiers. For example, the principles and advantages described herein can be applied to biasing low-noise amplifiers (LNAs) and/or other amplifiers.

Figure 1:
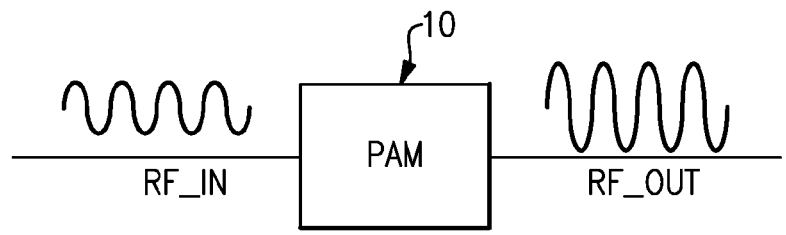
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module (PAM) 10 is configured to amplify an RF signal RF_IN to generate an amplified RF signal RF OUT. As described herein, the power amplifier module 10 can include one or more power amplifiers, including, for example, multi-stage power amplifiers.

Figure 2:
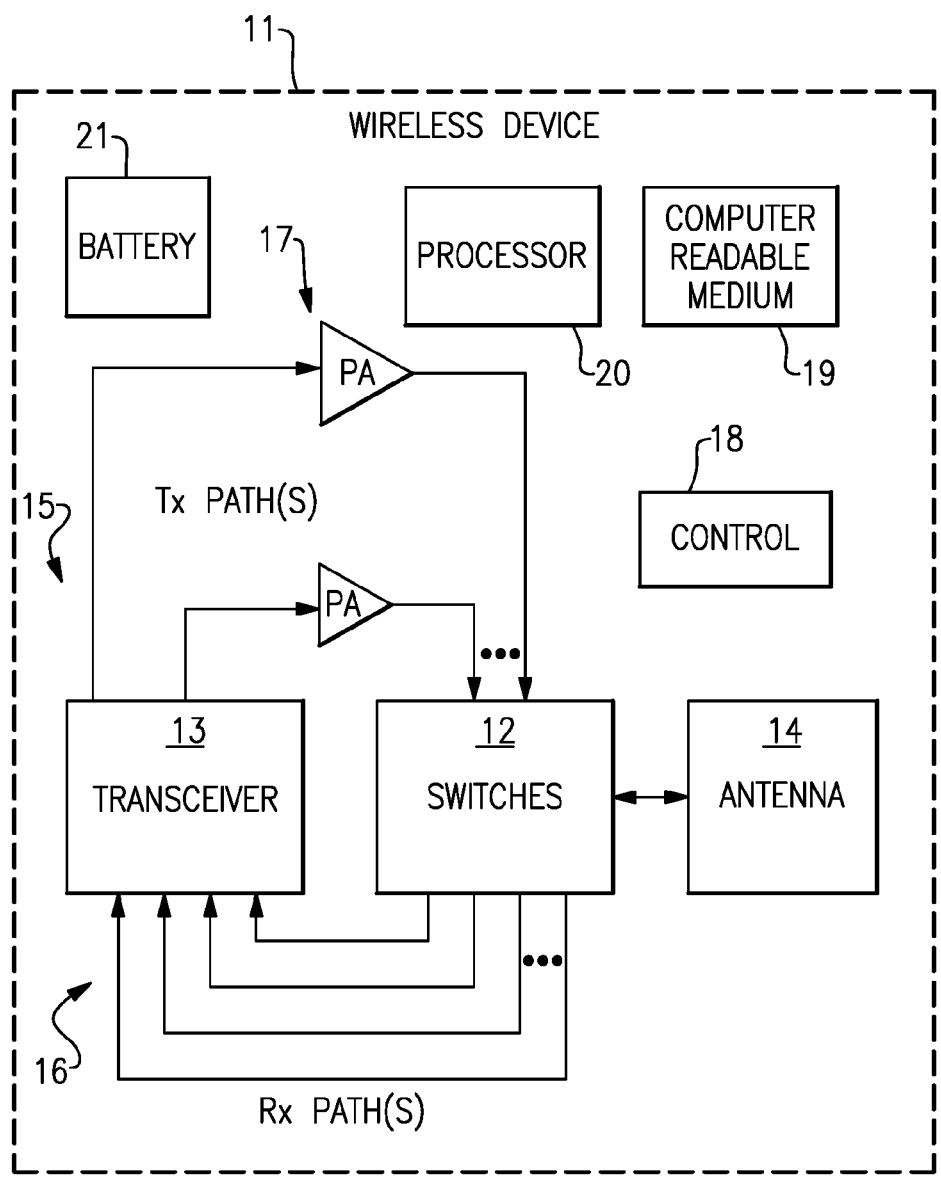
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include a low pass filter, such as an integrator, and a power amplifier bias circuit implementing one or more features of the present disclosure in a control component 18.

The example wireless device 11 depicted in FIG. 2 can represent a multi-band and/or multi-mode device such as a multi-band/multi-mode mobile phone. In certain embodiments, the wireless device 11 can include switches 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal or any other suitable pulsed signal. In certain embodiments, one or more of the power amplifiers 17 are configured to amplify a Wi-Fi signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, and/or other operating component(s). The control component 18 can be implemented on the same die as the power amplifier 17 in certain implementations. The control component 18 can be implemented on a different die than the power amplifier in some implementations. Non-limiting examples of the control component 18 that include an integrator (or low pass filter) and a bias circuit to compensate for dynamic error vector magnitude are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a processor or other programmable data processing apparatus to operate in a particular manner, such that the instructions stored in the computer-readable memory produce an article of manufacture including instructions which implement any combination of the operations described herein. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The battery 21 can be any suitable battery for use in the wireless device 11, including, for example, a lithium-ion battery.

Figure 3:
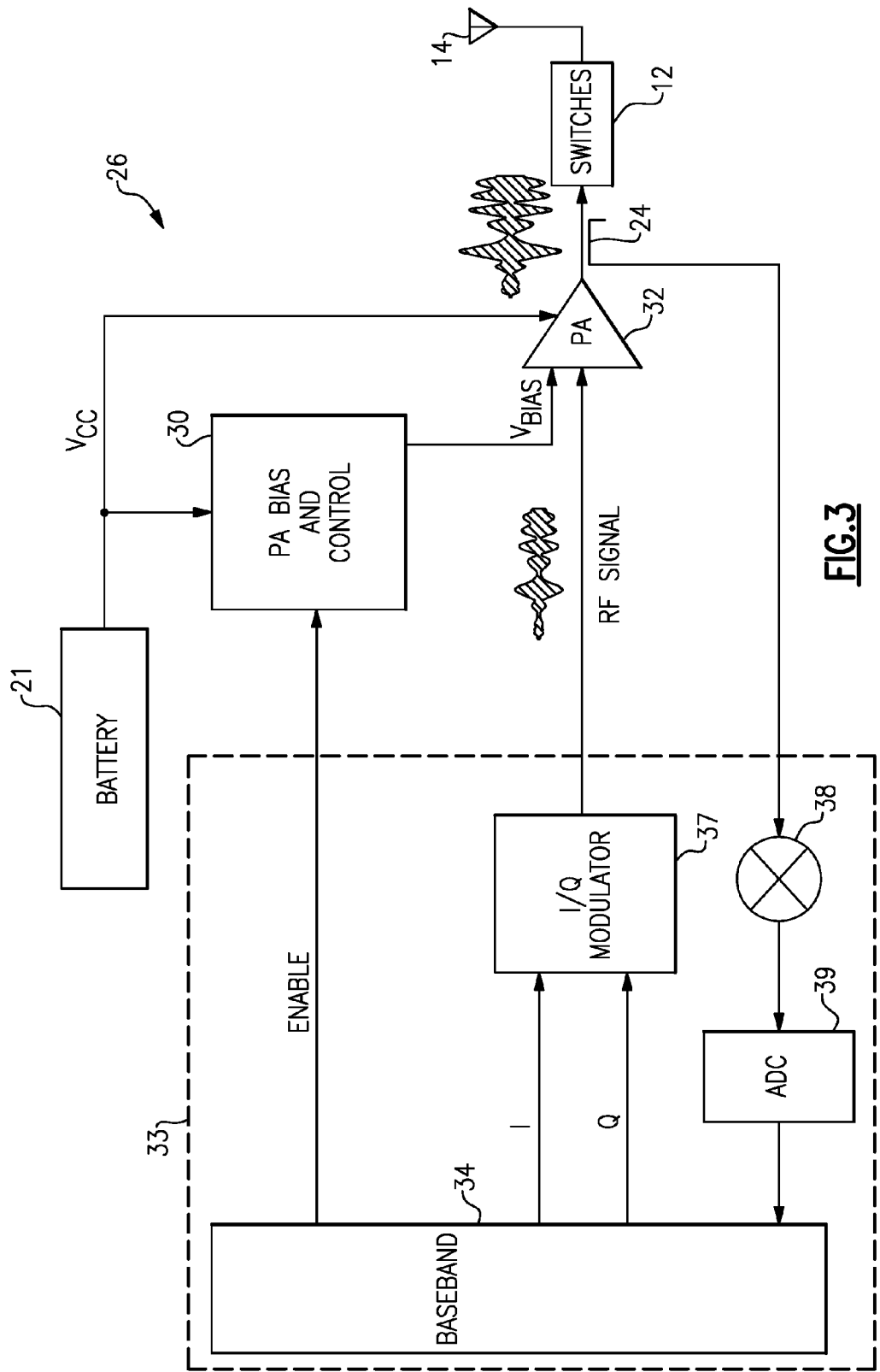
FIG. 3 is a schematic block diagram of one example of a power amplifier system.

FIG. 3 is a schematic block diagram of an illustrative power amplifier system 26. The illustrated power amplifier system 26 includes the switches 12, the antenna 14, the battery 21, a directional coupler 24, a power amplifier bias and control circuit 30, a power amplifier 32, and a transceiver 33. The power amplifier 32 can implement one of the power amplifiers 17 of FIG. 2, for example. The illustrated transceiver 33 includes a baseband processor 34, an I/Q modulator 37, a mixer 38, and an analog-to-digital converter (ADC) 39.

The baseband processor 34 can generate an I signal and a Q signal, which can be used to represent a sinusoidal wave or signal of a desired amplitude, frequency, and phase. For example, the I signal can represent an in-phase component of the sinusoidal wave and the Q signal can represent a quadrature component of the sinusoidal wave, which can be an equivalent phase-shifted representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, the like, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate a RF signal. For example, the I/Q modulator 37 can include digital-to-analog converters (DACs) configured to convert the I and Q signals from a digital format into an analog format, mixers for upconverting the I and Q signals to radio frequency, and a signal combiner for combining the upconverted I and Q signals into a RF signal suitable for amplification by the power amplifier 32. In certain implementations, the I/Q modulator 37 can include one or more filters configured to filter frequency content of signals processed therein.

The power amplifier bias and control circuit 30 can receive an enable signal ENABLE from the baseband processor 34 and a battery or power high voltage $V_{CC}$ from the battery 21, and can generate a bias voltage $V_{BIAS}$ for the power amplifier 32 based on the enable signal ENABLE. For instance, the power amplifier bias and control circuit 30 can set the bias voltage $V_{BIAS}$ to a voltage level to enable the power amplifier 32 when the enable signal ENABLE is in an activated state. Similarly, the power amplifier bias and control circuit 30 can set the bias voltage $V_{BIAS}$ to another voltage level to disenable the power amplifier 32 when the enable signal ENABLE is in a deactivated state. The power amplifier bias and control circuit 30 can also include circuitry configured to perform dynamic error vector magnitude correction as will be discussed in more detail later. Although FIG. 3 illustrates the battery 21 directly generating the power high voltage $V_{CC}$, in certain implementations, the power high voltage $V_{CC}$ can be a regulated voltage generated by a voltage regulator that is electrically powered using the battery 21. The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to improve and/or optimize the operation of the power amplifier system 26. For example, configuring the power amplifier system 26 in this manner can aid in controlling the power added efficiency (PAE) and/or linearity of the power amplifier 32.

Figure 4:
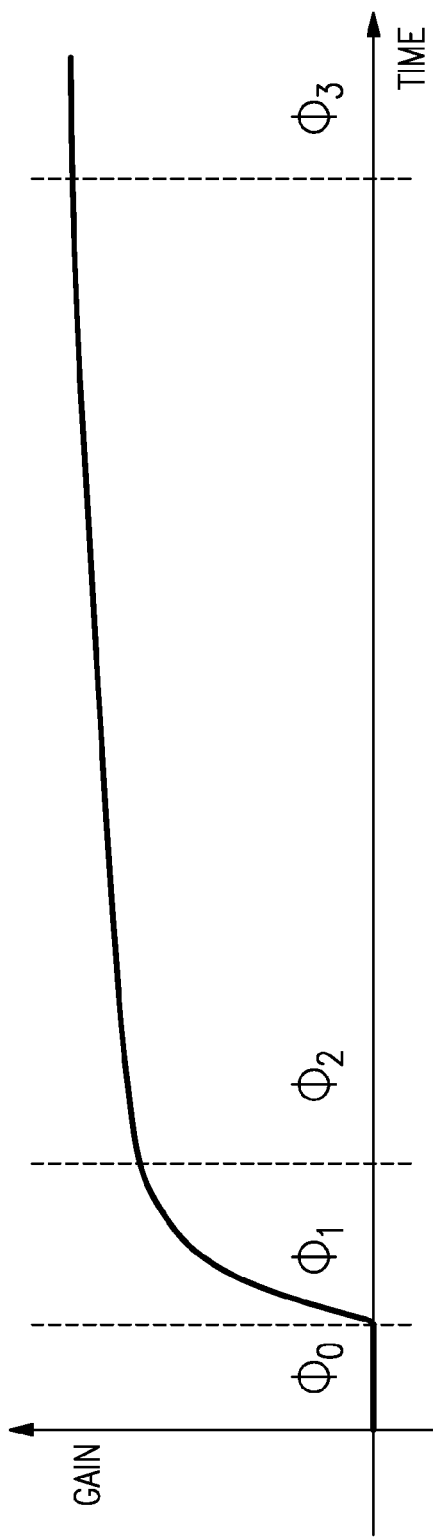
FIG. 4 is a graph of one example of power amplifier gain versus time.

FIG. 4 is a graph of power amplifier gain versus time for an example power amplifier. The example power amplifier can correspond to a power amplifier 32 of any of the illustrated embodiments, for example. It will be understood that the phases discussed with reference to FIG. 4 are phases of operation of the power amplifier. The graph includes an initial phase $\Phi_0$, in which the power amplifier is disabled and has a low gain, such as a gain of about 0. After the initial phase $\Phi_0$, the power amplifier is enabled. For example, the end of the initial phase $\Phi_0$ can correspond to a time instance when the enable signal ENABLE of FIG. 3 transitions from a deactivated state to an activated state.

As shown in FIG. 4, after being enabled, the power amplifier can operate in multiple phases associated with different gains. For example, the power amplifier can include a first phase $\Phi_1$, in which the power amplifier's gain can begin to settle based on a dominant influencing factor. Additionally, the power amplifier can include a second phase $\Phi_2$ in which gain can further settle based on one or more non-dominant influencing factors. Furthermore, in a third phase $\Phi_3$, the power amplifier's gain can be settled and substantially constant. In this third phase $\Phi_3$, the power amplifier amplifier's error vector magnitude (EVM) can correspond to the power amplifier's static error vector magnitude (SEVM). EVM of an unpulsed amplifier can be referred to as SEVM. EVM of a pulsed amplifier can be referred to as dynamic EVM (DEVM). Transient effects can cause additional error compared to an unpulsed condition. Accordingly, DEVM is typically worse than SEVM.

A power amplifier's gain can settle over time for a variety of reasons. For example, physical circuit limitations may prevent a power amplifier from turning on instantly. Additionally, when the power amplifier is activated, the power amplifier may begin to heat, which can lead to a thermal transient that changes the performance characteristics of the power amplifier's circuitry. The thermal transient can be affected by a variety of factors, such as self-heating of devices, mutual heating of devices, thermal mismatch between devices, cross die heat transfer, the like, or any combination thereof.

In certain applications, a power amplifier can provide amplification before the gain of the power amplifier system is fully settled. For example, the power amplifier may provide amplification during the second phase $\Phi_2$, since the power amplifier's thermal time constant may be longer, and in some instances significantly longer, than the power amplifier's rated or specified turn-on time. Before the power amplifier's gain is fully settled, the power amplifier can have a dynamic error vector magnitude (DEVM) that can be worse that the power amplifier's SEVM.

From a system perspective, the distortion of the RF input signal provided to the amplifier for amplification can be represented by either the DEVM or SEVM figure of merit. The distortion that the RF input signal experiences is typically dependent upon time after the amplifier is activated and before the amplifier has achieved a steady-state condition. Moreover, the receiver demodulation level can be set during a preamble, so any change in gain after that can cause error and a relatively poor EVM.

Although FIG. 4 illustrates the power amplifier's gain changing over time due to thermal effects, it will be understood that other parameters of the power amplifier can change with time, including, for example, the amplifier's phase. The principles and advantages described herein are applicable to gain correction and/or to other types of correction, such as phase correction.

Figure 5A:
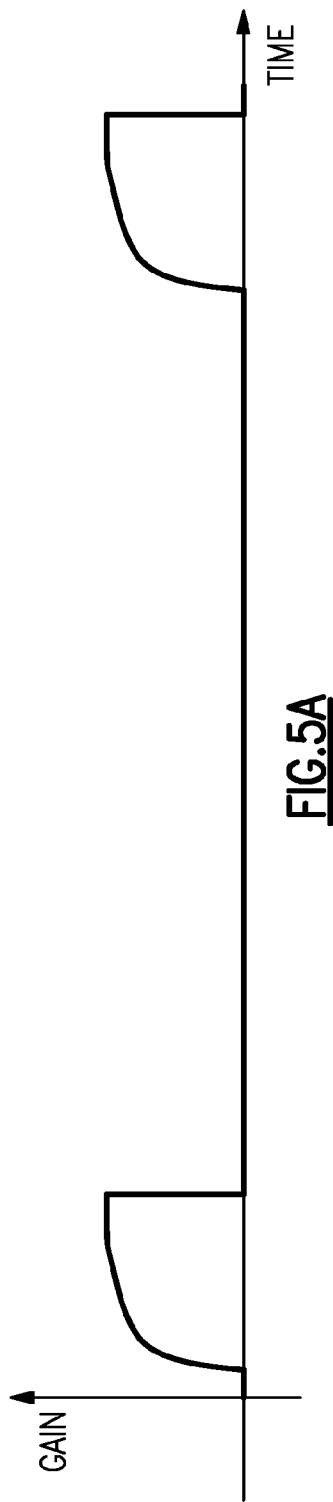
FIGS. 5A and 5B are graphs of two examples of power amplifier gain versus time.
Figure 5B:
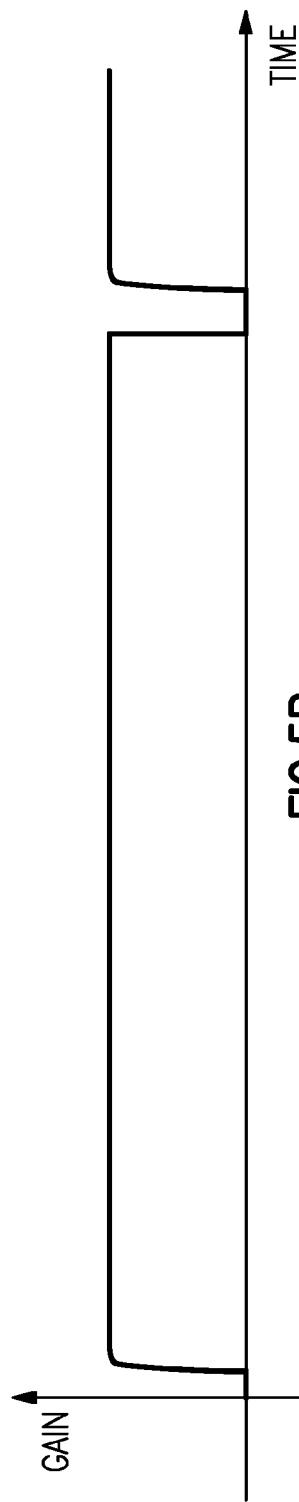

FIGS. 5A and 5B are graphs of two examples of power amplifier gain versus time curves. These graphs can represent the gain of the power amplifier 32, for example. In FIG. 5A, a power amplifier is turned off for a relatively long duration between activation cycles. In contrast, in FIG. 5B, a power amplifier is turned off for a relatively brief duration between activation events. In the curve shown in FIG. 5A, the temperature of the power amplifier can be relatively cold at the start of the second pulse. The relatively cold temperature of the power amplifier can increase the impacts of transient gain effects associated with pulsing the power amplifier. In contrast, operating the same power amplifier in accordance with the curve shown in FIG. 5B, the temperature of the power amplifier can be relatively hot at the start of the second pulse, which can result in the power amplifier having a relatively small amount of transient gain effects.

Absent compensation, the DEVM of the power amplifier can vary based on the pulsing operations of the power amplifier, including, for example, an off-time between pulses and/or a duty cycle of the pulses. The dependence of the power amplifier's gain and/or phase on pulsing operations can make it difficult to compensate for the power amplifier's DEVM using static techniques, such as resistor-capacitor (RC) compensation.

Operating conditions of an amplifier, such as a power amplifier, can affect DEVM. For example, the duty cycle of the amplifier can affect DEVM. However, previous DEVM compensation schemes have been optimized for a particular set of operating conditions. In these schemes. DEVM correction was not adjustable based on operating conditions. As such, the same DEVM compensation has been applied to correct for DEVM regardless of operating conditions of the amplifier, such as the various phases of operation shown in FIG. 4 or the various temperature factors associated with the curves of FIGS. 5A and 5B.

Amplifier performance can be adjusted as operating conditions change in accordance with the DEVM correction described herein. A bias signal provided to an amplifier while the amplifier is activated can be adjusted based on changes in operating conditions of the amplifier. Such operating conditions can include, for example, heating of the amplifier or other environmental conditions. A DEVM correction signal can be adjusted based on a duty cycle of the amplifier. An enable signal of the amplifier can be indicative of a duty cycle of the amplifier. Accordingly, the enable signal can be integrated to generate a DEVM correction signal. A bias signal for the amplifier can be adjusted based on the DEVM correction signal. This can adjust the bias signal such that the DEVM compensation is based on the duty cycle of the amplifier. Effects of duty cycle on DEVM can be reduced and/or eliminated. As such, the amplifier can be biased to mitigate the thermal factors affecting DEVM, such the thermal affects associated with the curves shown in FIGS. 5A and 5B. Moreover, DEVM correction can be adjusted over time to adjust for changes in the duty cycle of the amplifier over time.

Figure 6:
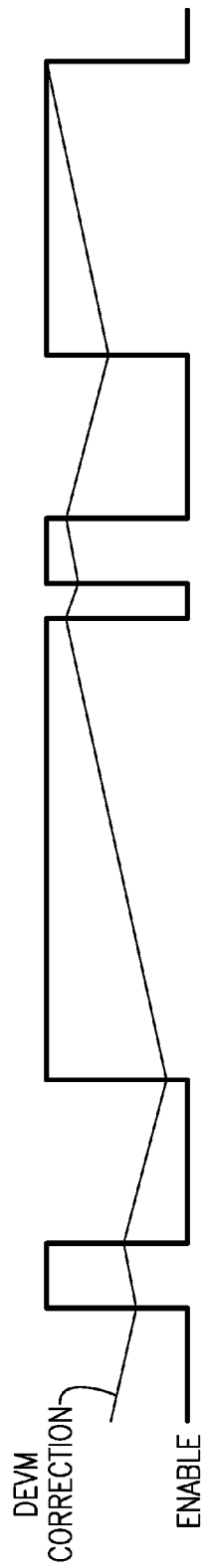
FIG. 6 is a graph of a dynamic error vector magnitude correction signal and an enable signal over time according to an embodiment.

FIG. 6 is a graph of a dynamic error vector magnitude correction signal and an enable signal over time according to an embodiment. The enable signal ENABLE is indicative of the duty cycle of the amplifier. The duty cycle of an amplifier can refer to a percentage of time that the amplifier is activated. The amount of time that the enable signal is asserted (for example, at a logic 1 voltage level as illustrated) corresponds to when the amplifier is activated. In this example, relatively higher duty cycles of the amplifier can correspond to relatively higher values of the correction signal DEVM CORRECTION, and relative lower duty cycles of the amplifier can correspond to relatively lower values of the correction signal DEVM CORRECTION. By integrating the enable signal ENABLE over time, a correction signal DEVM CORRECTION can be generated that it is indicative of the duty cycle of the amplifier. The correction signal DEVM CORRECTION can be provided to a bias circuit to adjust a bias signal for the amplifier.

Changes in the bias signal can be inversely proportional to changes in the duty cycle of the amplifier. For instance, with a duty cycle of 99%, the amplifier is on 99% of the time and off 1% of the time. This can cause the amplifier to be hot. As the duty cycle is adjusted down toward 1%, where the amplifier is on 1% of the time and off 99% of the time, the amplifier should cool. As the amplifier cools, a relatively larger bias voltage can correct for DEVM to account for thermal factors.

A duty cycle tracking circuit can track the duty cycle of an amplifier to aid in DEVM correction. The duty cycle tracking circuit can be any suitable circuit that provides different values based on changes in a duty cycle of the amplifier. The duty cycle tracking circuit can generate an indication of a duty cycle of an amplifier over time and adjust the indication of the duty cycle of the amplifier over time as the duty cycle of the amplifier changes. For instance, the duty cycle tracking circuit can use an enable signal for the amplifier to track the duty cycle. Examples of a suitable duty cycle tracking circuit include without limitation a low pass filter, an integrator, a charge pump, an accumulator, a decimator, and an up-down counter. The duty cycle tracking circuit can be in communication with a bias circuit that is configured to generate a bias signal based at least partly on the indication of duty cycle over time and to provide the bias signal to the amplifier to bias the amplifier. The indication of duty cycle can be, for example, an enable signal for the amplifier, a signal indicative of a duration of a power amplifier pulse, or a signal indicative of an amount of time between successive power amplifier pulses.

Figure 7A:
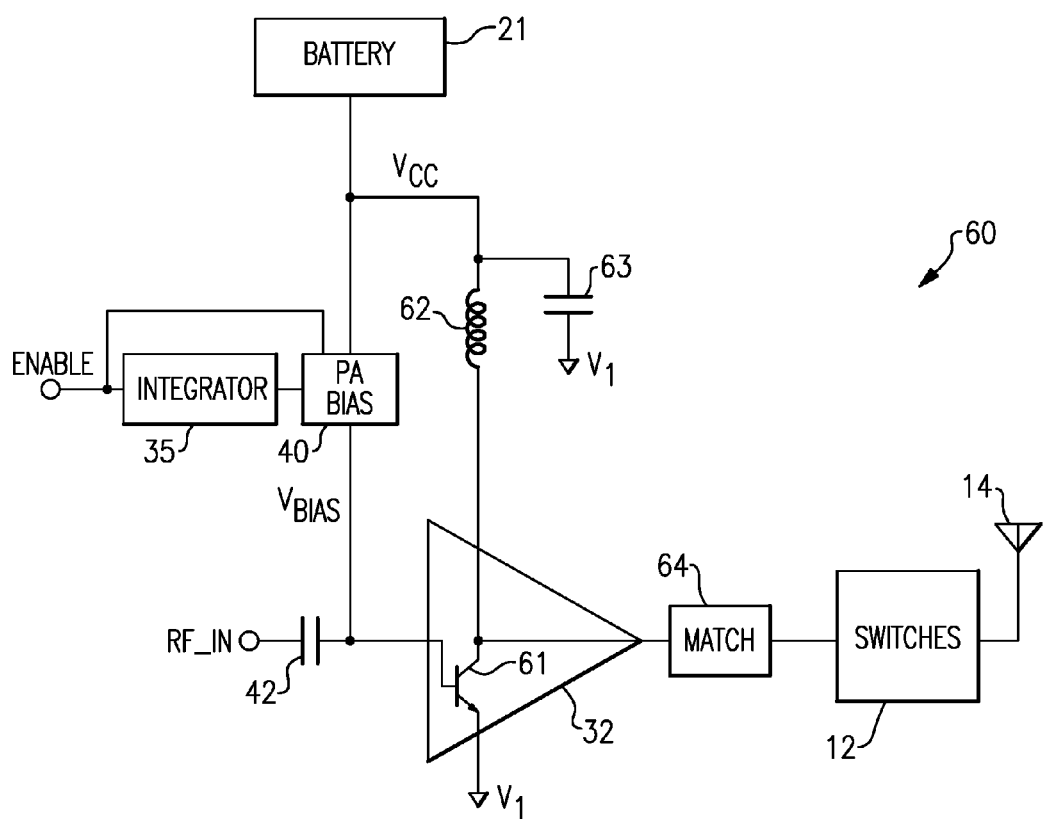
FIGS. 7A to 7C are schematic block diagrams of illustrative power amplifier systems with dynamic error vector magnitude correction according to certain embodiments.
Figure 7B:
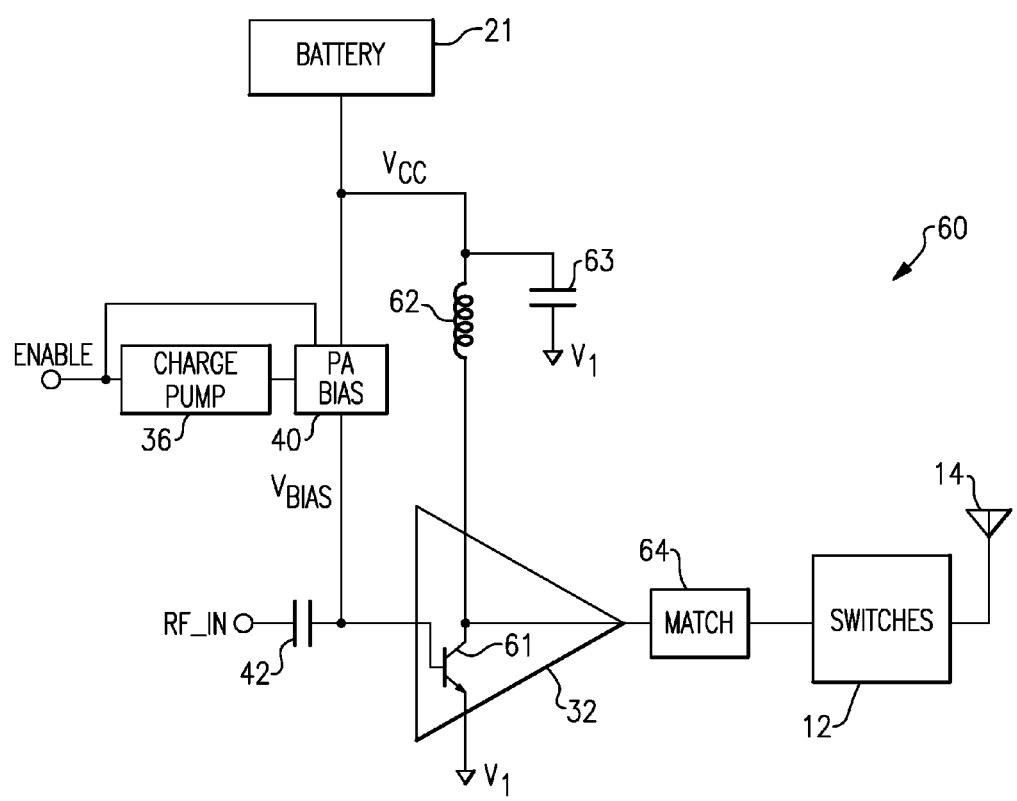
Figure 7C:
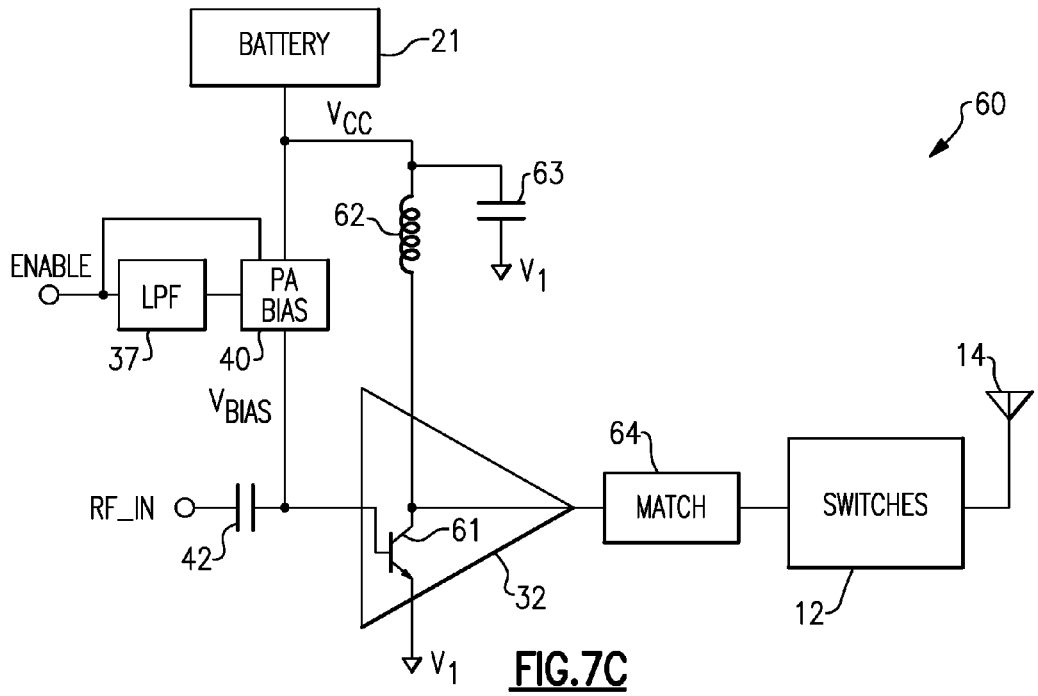

FIGS. 7A to 7C are schematic block diagrams of illustrative power amplifier systems 60 with dynamic error vector magnitude correction according to certain embodiments. The power amplifier systems 60 of FIGS. 7A to 7C are substantially the same except that these power amplifier systems include different duty cycle tracking circuits. In these figures, the duty cycle tracking circuit is illustrated as an integrator 35 (FIG. 7A), a charge pump 36 (FIG. 7B), or a low pass filter 37 (FIG. 7C). FIG. 7A includes an integrator 35 configured to generate a correction signal by integrating the enable signal ENABLE. FIG. 7B illustrates a charge pump 36, which is one type of integrator that can integrate the enable signal ENABLE, in place of the integrator 35. FIG. 7C includes a low pass filter 37 configured to generate a correction signal by low pass filtering the enable signal ENABLE. The low pass filter 37 can be implemented by any suitable circuit that implements a low pass filtering function.

An integrator is one example of a low pass filter. As used herein, the term "low pass filter" encompasses integrators, such as charge pumps, and a variety of other circuits that perform a low pass filtering function, such as an accumulator, a decimator, or an up-down counter. The low pass filters discussed herein can be analog circuits in certain embodiments. According to other embodiments, the low pass filters discussed herein can be digital circuits.

FIG. 7A will be described in more detail for illustrative purposes. It will be understood that any of the principles and advantages discussed with reference to FIG. 7A can be applied to the power amplifier system 60 of FIG. 7B in which the charge pump 36 implements the integrator 35 and/or to the power amplifier system 60 of FIG. 7C that illustrates a low pass filter 37 in place of the integrator 35, as appropriate.

Although FIGS. 7A to 7C illustrate one implementation of the power amplifier 32, it will be understood that the principles and advantages described herein can be implemented in connection with a variety of other power amplifier structures, including, for example, multi-stage power amplifier structures and/or power amplifiers employing other transistor structures. As one example, the principles and advantages discussed herein can be applied to power amplifiers implemented by field effect transistors configured to receive a bias signal at a gate. Furthermore, the principles and advantages discussed herein can be implemented in connection with any amplifier that can benefit from DEVM compensation.

Referring to FIG. 7A, a schematic block diagram of an example power amplifier system 60 will be described. The illustrated power amplifier system 60 includes an integrator 35, a power amplifier bias circuit 40, the battery 21, the power amplifier 32, an inductor 62, a first capacitor 63, a second capacitor 42, an impedance matching block 64, the switches 12, and the antenna 14. In some embodiments, the power amplifier system 60 can include more or fewer elements than illustrated in FIG. 7A or any of the other figures.

The integrator 35 can receive an enable signal ENABLE for the power amplifier 32. The integrator 35 can generate a dynamic correction signal by integrating the enable signal ENABLE. Accordingly, the dynamic correction signal can cause DEVM correction to track the duty cycle of the power amplifier 32. An example of the dynamic correction signal generated by the integrator 35 is shown in FIG. 6. The integrator 35 can be any suitable integrator, such as the example integrator 35 of FIG. 8 or the charge pump 36 of FIG. 7B.

Figure 8:
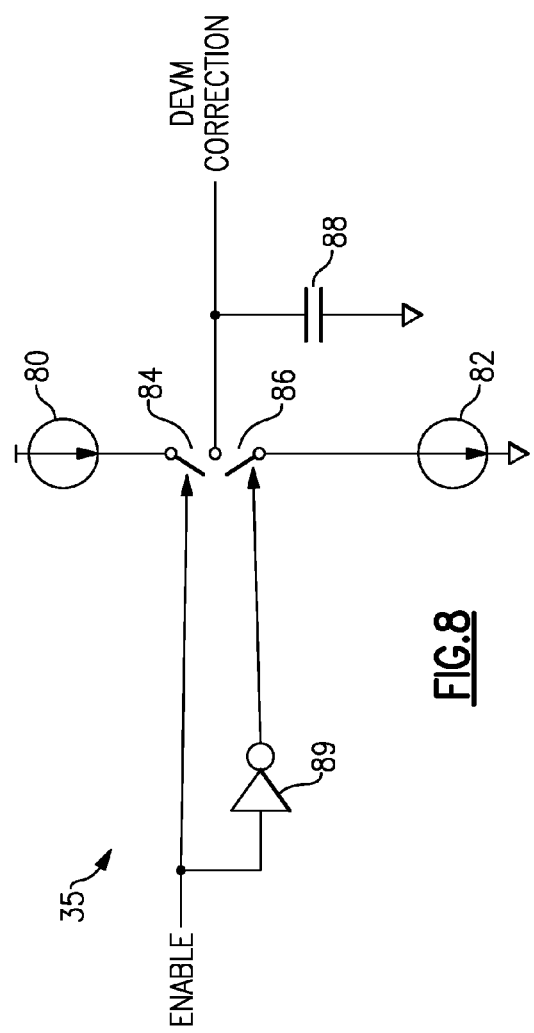
FIG. 8 is a circuit diagram of an example integrator of FIG. 7A.

Referring now to FIG. 8, an example of the integrator 35 of FIG. 7A will be described. As illustrated in FIG. 8, the example integrator 35 includes a first current source 80, a second current source 82, a first switch 84, a second switch 86, a capacitor 88, and an inverter 89. The first current source 80 is selectively operatively coupled to the capacitor 88 via the first switch 84. When the enable signal ENABLE is asserted, the first current source 80 is operatively coupled to the capacitor 88. This causes the capacitor 88 to charge. The inverter 89 can invert the enable signal ENABLE and provide the inverted enable signal to the second switch 86. The second current source 82 is selectively operatively coupled to the capacitor 88 via the second switch 86. When the enable signal ENABLE is de-asserted, the second current source 82 is operatively coupled to the capacitor 88. This causes the capacitor 88 to discharge. As such, the dynamic correction signal DEVM CORRECTION is an integrated version of the enable signal ENABLE.

Referring back to FIG. 7A, the illustrated power amplifier 32 includes a bipolar power amplifier transistor 61 having an emitter, a base, and a collector. The emitter of the bipolar power amplifier transistor 61 can be electrically connected to a first or power low voltage $V_1$, which can be, for example, a ground supply. A radio frequency input signal RF_IN can be provided to the base of the bipolar power amplifier transistor 61 through the first capacitor 42. The bipolar power amplifier transistor 61 can amplify the RF input signal RF_IN and provide the amplified RF signal at the collector. The bipolar power amplifier transistor 61 can be any suitable device. In one implementation, the bipolar power amplifier transistor 61 is a heterojunction bipolar transistor (HBT).

The power amplifier 32 can be configured to provide the amplified RF signal to the switches 12. The switches 12 can implement any combination of features of the switches 12 of FIG. 2. For instance, the switches 12 can selectively electrically couple the output of the power amplifier 12 to the antenna 14. The impedance matching block 64 can aid in terminating the electrical connection between the power amplifier 32 and the switches 12. For example, the impedance matching block 64 can increase power transfer and/or reduce reflections of the amplified RF signal.

The inductor 62 can be included to aid in electrically powering the power amplifier 32 with the power high voltage $V_{CC}$ from the battery 21 while choking or blocking high frequency RF signal components. The inductor 62 can include a first end electrically connected to the power high voltage $V_{CC}$ and a second end electrically connected to the collector of the bipolar power amplifier transistor 61. The first or decoupling capacitor 63 is electrically connected between the power high voltage $V_{CC}$ and the power low voltage $V_1$ and can provide a low impedance path to high frequency signals, which can thereby reduce the noise of the power high voltage $V_{CC}$, improve power amplifier stability, and/or improve the performance of the inductor 62 as a RF choke.

The power amplifier bias circuit 40 is configured to receive an enable signal ENABLE, a correction signal from the integrator 35, and the battery or power high voltage $V_{CC}$. In some instances, the power high voltage $V_{CC}$ can be a regulated version of the battery voltage. The power amplifier bias circuit 40 can use the correction signal and the enable signal ENABLE to generate a bias voltage $V_{BIAS}$ for biasing the power amplifier 32. For example, as illustrated in FIG. 7A, the power amplifier bias circuit 40 can be used to generate a bias voltage $V_{BIAS}$ that can be used to bias the base of the bipolar power amplifier transistor 61 of the power amplifier 32. The power amplifier bias circuit 40 can use the enable signal ENABLE to control or vary a magnitude of the bias voltage $V_{BIAS}$ over time so as to enable or disable the power amplifier and thereby pulse the power amplifier's output. For example, when the enable signal ENABLE indicates the power amplifier 32 should be activated, the power amplifier bias circuit 40 can change the amplitude of the bias voltage $V_{BIAS}$ so as to achieve a desired gain of the power amplifier 32. Similarly, when the enable signal ENABLE indicates that the power amplifier 32 should be deactivated, the power amplifier bias circuit 40 can decrease the bias voltage $V_{BIAS}$ such that the gain of the power amplifier 32 is relatively low, for example, about 0.

The power amplifier bias circuit 40 can also use the correction signal to adjust a magnitude of the bias voltage $V_{BIAS}$ over time to compensate for DEVM. For example, when the correction signal indicates the power amplifier 32 is operating under relatively hot conditions, such as conditions associated with the curve of FIG. 5B, the power amplifier bias circuit 40 can apply a relatively small increase to the bias voltage $V_{BIAS}$. As another example, when the correction signal indicates the power amplifier 32 is operating under relatively cold conditions, such as conditions associated with the curve of FIG. 5A, the power amplifier bias circuit 40 can apply a relatively large increase to the bias voltage $V_{BIAS}$. As such, the power amplifier bias circuit 40 can provide a higher bias voltage $V_{BIAS}$ when the power amplifier 32 is activated and operating under relatively cold conditions than when the power amplifier 32 is activated and operating under relatively hot conditions. Accordingly, the power amplifier bias circuit 40 can adjust the bias voltage $V_{BIAS}$ to compensate for DEVM based on operating conditions as the operating conditions change.

Figure 9:
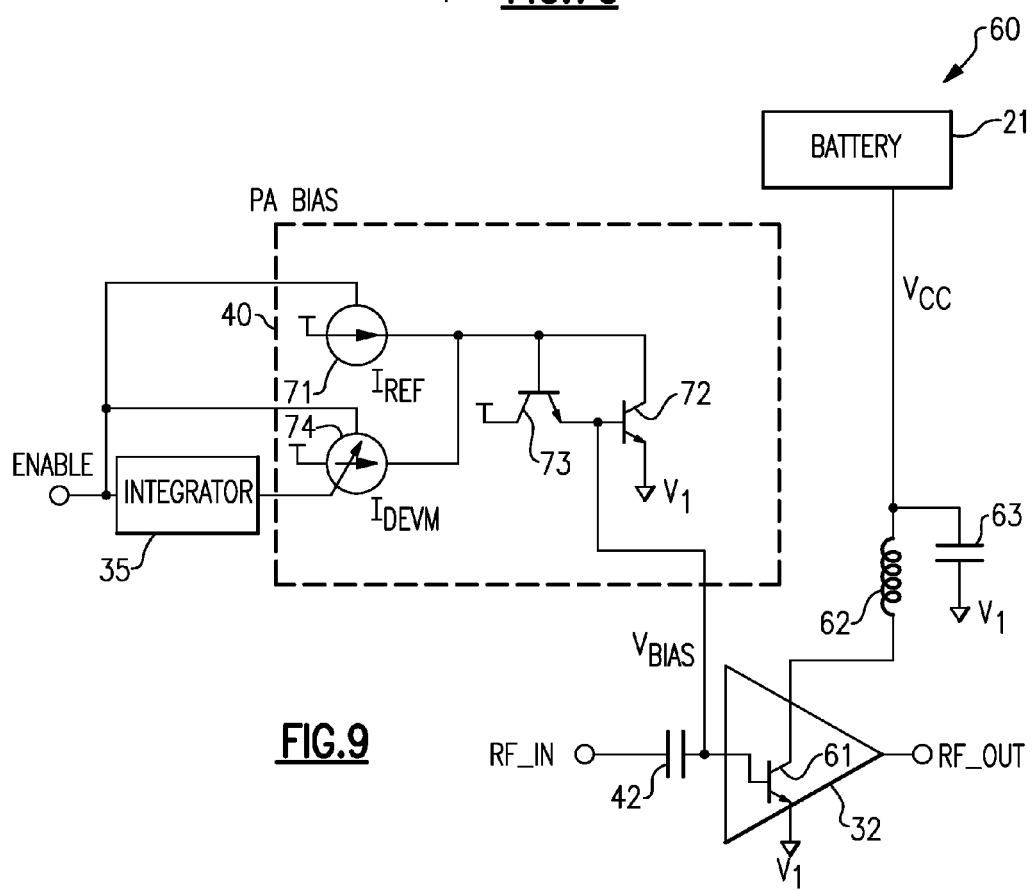
FIG. 9 is a schematic block diagram of an example power amplifier system that includes a circuit diagram of an example power amplifier bias circuit.

With reference to FIG. 9, an example power amplifier bias circuit 40 will be described. The power amplifier bias circuit 40 shown in FIG. 9 is an example of a power amplifier bias circuit 40 that can be implemented in any of FIGS. 7A to 7C. The power amplifier bias circuit 40 of FIG. 9 can be implemented in the power amplifier system 60 as illustrated. The illustrated power amplifier bias circuit 40 includes a reference current source 71, an adjustable current source 74, a reference bipolar transistor 72, and a base current helper bipolar transistor 73. The reference current source 71 is configured to generate a reference current $I_{REF}$ when the enable signal ENABLE is asserted. In some implementations, the reference current $I_{REF}$ provided by the reference current source 71 can provide a substantially fixed current. The adjustable current source 74 is configured to generate an adjustable correction current $I_{DEVM}$ based on the correction signal from the integrator 35. The adjustable current source 74 can be enabled when the enable signal ENABLE is asserted and disabled when the enable signal ENABLE is de-asserted. As such, when the power amplifier 32 is disabled, the reference current source 71 and the adjustable current source 74 can both be disabled.

As illustrated, the reference current $I_{REF}$ and the adjustable correction current $I_{DEVM}$ can both be provided to the collector of the reference bipolar transistor 72. In addition, the reference current $I_{REF}$ and the adjustable correction current $I_{DEVM}$ can both be provided to the base of the current helper bipolar transistor 73. The emitter of the base current helper bipolar transistor 73 can be electrically coupled to the base of the reference bipolar transistor 72. The base of the reference bipolar transistor 72 can be electrically coupled to the base of the bipolar power amplifier transistor 61. In other embodiments (not illustrated), the base of the reference bipolar transistor 72 can be electrically coupled to the base of another suitable bipolar transistor configured to amplify an RF signal.

In the illustrated configuration, the power amplifier bias circuit 40 is configured to receive an enable signal ENABLE, which can be used to selectively pulse the output of the power amplifier 32 based on a state of the enable signal. For example, when the power amplifier 32 is configured to transmit a WLAN signal, such as a Wi-Fi signal, the enable signal ENABLE can be selectively controlled so as to pulse the output of the power amplifier 32. As illustrated, the power amplifier bias circuit 40 is configured to generate a bias voltage $V_{BIAS}$, which is provided to the base of the bipolar reference transistor 72 and to the bipolar power amplifier transistor 61. The correction signal provided by the integrator 35 can adjust the adjustable current $I_{DEVM}$ generated by the adjustable current source 74 to thereby adjust the bias voltage $V_{BIAS}$ to compensate for DEVM.

In certain embodiments, the low pass filter 37, the power amplifier bias circuit 40 and the power amplifier 32 can be integrated on a single die with one or more other components to form a packaged power amplifier module. In one embodiment, the single die can be a SiGe die. In some other embodiments, the power amplifier bias circuit 40 and the low pass filter 37 can be embodied on a first die and the power amplifier 32 can be embodied on separate second die in a packaged power amplifier module. In one embodiment, the power amplifier 32 can be on a GaAs die and the power amplifier bias circuit 40 and the low pass filter 37 can be on a CMOS die. In another embodiment, a packaged power amplifier module can include the power amplifier bias circuit 40 on a first die, the power amplifier 32 on a second die, and the low pass filter 37 on a third die. The packaged power amplifier modules can be, for example, mounted to a RF circuit board associated with the wireless device 11 of FIG. 2. It will be understood that in any of the embodiments discussed herein, the low pass filter 37 can be implemented as the integrator 35, the charge pump 36, or any other circuit configured to perform a low pass filtering function such as an accumulator, a decimator, or an up-down counter.

Figure 10A:
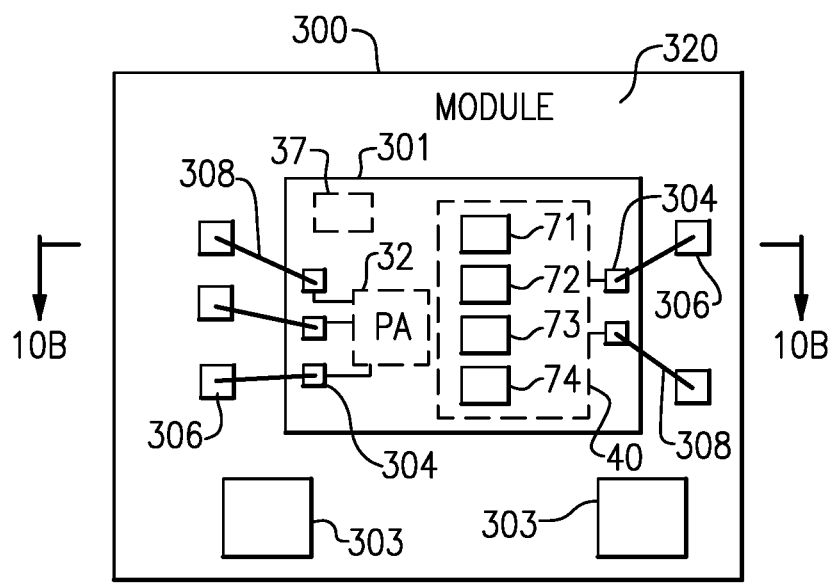
FIG. 10A is a schematic diagram of one example of a packaged power amplifier module.
Figure 10B:
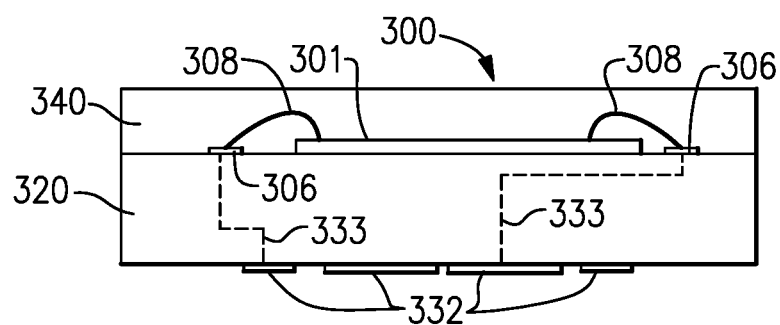
FIG. 10B is a schematic diagram of a cross-section of the packaged power amplifier module of FIG. 10A taken along the lines 10B-10B.

FIG. 10A is a schematic diagram of one example of a packaged power amplifier module 300. FIG. 10B is a schematic diagram of a cross-section of the packaged power amplifier module 300 of FIG. 10A taken along the lines 10B-10B.

The packaged power amplifier module 300 includes an IC or die 301, surface mount components 303, wirebonds 308, a package substrate 320, and encapsulation 340. The package substrate 320 includes pads 306 formed from conductors disposed therein. Additionally, the die 301 includes pads 304 and the wirebonds 308 can electrically connect the pads 304 of the die 301 to the pads 306 of the package substrate 301.

As illustrated in FIGS. 10A and 10B, the die 301 includes the power amplifier 32, the low pass filter 37, and the power amplifier bias circuit 40 formed therein. The power amplifier bias circuit 40 includes a reference current source 71, an adjustable current source 74, a reference bipolar transistor 72, and a base current helper bipolar transistor 73, which can be as described earlier.

The packaging substrate 320 can be configured to receive a plurality of components such as the die 301 and the surface mount components 303, which can include, for example, surface mount capacitors and/or inductors.

As shown in FIG. 10B, the packaged power amplifier module 300 can include a plurality of contact pads 332 disposed on the side of the packaged power amplifier module 300 opposite the side used to mount the die 301. Configuring the packaged power amplifier module 300 in this manner can aid in connecting the packaged power amplifier module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 10B, the electrical connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged power amplifier module 300 can also include one or more packaging structures to, for example, provide protection and/or to facilitate handling of the packaged power amplifier module 300. Such a packaging structure can include overmold or encapsulation 340 formed over the packaging substrate 320 and the components and die(s) disposed thereon.

It will be understood that although the packaged power amplifier module 300 is described in the context of wirebond-based electrical connections, one or more features of the present disclosure can also be implemented in other packaging configurations, including, for example flip-chip configurations.

Figure 10C:
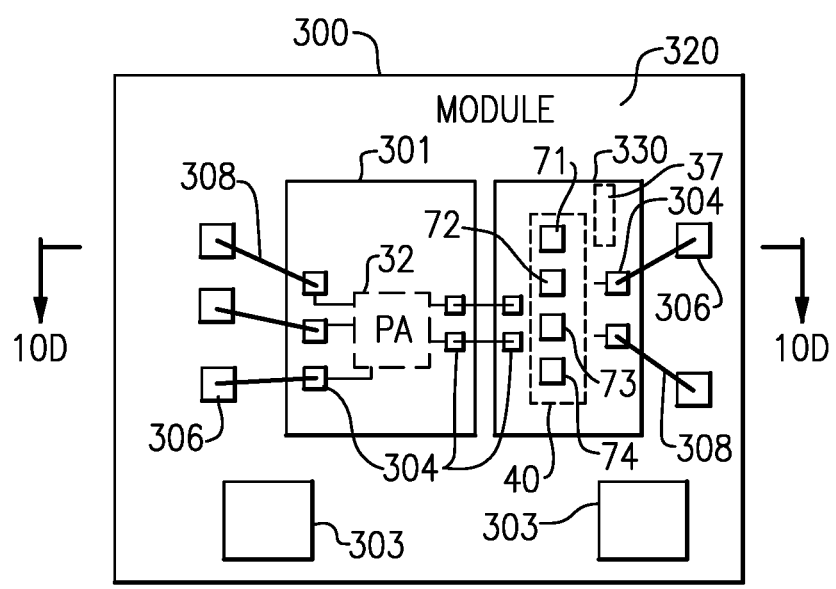
FIG. 10C is a schematic diagram of another example of a packaged power amplifier module.
Figure 10D:
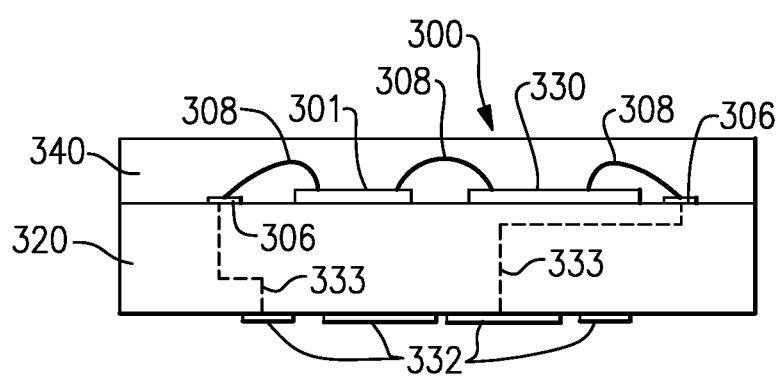
FIG. 10D is a schematic diagram of a cross-section of the packaged power amplifier module of FIG. 10C taken along the lines 10D-10D.

FIG. 10C is a schematic diagram of another example of a packaged power amplifier module 300. FIG. 10D is a schematic diagram of a cross-section of the packaged power amplifier module 300 of FIG. 10C taken along the lines 10D-10D. As shown in FIG. 10C, the power amplifier 32 can be on a first die 301 and the low pass filter 37 and the power amplifier bias circuit 40 can be on a second die 330. One or more wirebonds 308 or other electrical connections can electrically couple the first die 301 to the second die 330. The separate dies can be formed using different process technology. For instance, the first die 301 can be a GaAs die and the second die 302 can be a CMOS die.

Some of the embodiments described above have provided examples in connection with power amplifiers and/or mobile devices. However, the principles and advantages of the embodiments can be used for any other systems or apparatus that could benefit from DEVM compensation.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without user input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
    a power amplifier configured to amplify a radio frequency signal;
    a low pass filter configured to generate a correction signal based at least partly on an indication of a duty cycle of the power amplifier; and
    a bias circuit configured to generate a bias signal based at least partly on the correction signal such that changes in the bias signal are inversely proportional to changes in the duty cycle of the power amplifier, and the bias circuit configured to bias the power amplifier using the bias signal.

2. The power amplifier module of claim 1 wherein the indication of duty cycle of the power amplifier is an enable signal for the power amplifier.

3. The power amplifier module of claim 1 wherein the radio frequency signal is a wireless local area network signal.

4. The power amplifier module of claim 1 wherein the low pass filter includes an integrator configured to integrate the indication of the duty cycle of the power amplifier.

5. The power amplifier module of claim 1 wherein the power amplifier includes a bipolar transistor having a base configured to receive the bias signal.

6. The power amplifier module of claim 1 wherein the bias circuit includes a current source configured to generate a correction current based at least partly on the correction signal.

7. The power amplifier module of claim 1 wherein a single die includes the power amplifier, the low pass filter, and the bias circuit.

8. The power amplifier module of claim 7 wherein the single die is a silicon germanium die.

9. The power amplifier module of claim 1 wherein a first die includes the low pass filter and the bias circuit and a second die includes the power amplifier.

10. An amplifier system comprising:
    an amplifier configured to amplify a radio frequency signal;
    a duty cycle tracking circuit configured to track a duty cycle of the amplifier and to provide a signal representative of the duty cycle of the amplifier over time, the duty cycle tracking circuit including a low pass filter; and
    a bias circuit configured to generate a bias signal based at least partly on the signal representative of the duty cycle of the amplifier over time and to bias the amplifier using the bias signal so as to compensate for variation in amplifier gain due to changes in the duty cycle.

11. The amplifier system of claim 10 wherein the bias circuit includes a current source configured to provide a current that is adjustable based at least partly on the signal representative of the duty cycle of the amplifier over time, and the bias circuit is configured to generate the bias based at least partly on the current.

12. The amplifier system of claim 10 wherein the low pass filter is an integrator.

13. The amplifier system of claim 10 wherein the low pass filter is arranged to receive an enable signal for the amplifier.

14. The amplifier system of claim 10 wherein the radio frequency signal is a wireless local area network signal.

15. The amplifier system of claim 10 wherein the amplifier includes a bipolar transistor having a base configured to receive the bias signal.

16. The amplifier system of claim 10 wherein the amplifier includes a power amplifier.

17. A wireless device comprising:
a power amplifier configured to provide a radio frequency signal;
an antenna configured to transmit the radio frequency signal;
a duty cycle tracking circuit configured to track a duty cycle of the power amplifier and to provide a signal representative of the duty cycle of the power amplifier over time, the duty cycle tracking circuit including a low pass filter; and
a bias circuit configured to generate a bias signal based at least partly on the signal representative of the duty cycle of the power amplifier over time and to bias the power amplifier using the bias signal so as to compensate for variation in power amplifier gain due to changes in the duty cycle of the power amplifier.

18. The wireless device of claim 17 wherein the radio frequency signal is a wireless local area network signal.

19. The wireless device of claim 17 configured as a mobile phone.

20. The wireless device of claim 17 wherein the low pass filter is an integrator configured to receive an enable signal for the power amplifier.

\* \* \* \* \*